(12) United States Patent
Yu et al.

(10) Patent No.: US 10,094,023 B2
(45) Date of Patent: Oct. 9, 2018

(54) METHODS AND APPARATUS FOR CHEMICAL VAPOR DEPOSITION OF A COBALT LAYER

(71) Applicant: APPLIED MATERIALS, INC., Santa Clara, CA (US)

(72) Inventors: Sang Ho Yu, Cupertino, CA (US); Mei Chang, Saratoga, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/815,156

(22) Filed: Jul. 31, 2015

(65) Prior Publication Data

US 2016/0035619 A1 Feb. 4, 2016

Related U.S. Application Data

(60) Provisional application No. 62/032,391, filed on Aug. 1, 2014, provisional application No. 62/032,341, filed on Aug. 1, 2014.

(51) Int. Cl.

| | |
|---|---|
| *H01L 21/00* | (2006.01) |
| *C23C 16/46* | (2006.01) |
| *C23C 16/458* | (2006.01) |
| *C23C 16/18* | (2006.01) |
| *C23C 16/56* | (2006.01) |

(Continued)

(52) U.S. Cl.
CPC ............ *C23C 16/46* (2013.01); *C23C 16/18* (2013.01); *C23C 16/4584* (2013.01); *C23C 16/4586* (2013.01); *C23C 16/56* (2013.01); *H01L 21/28556* (2013.01); *H01L 21/76843* (2013.01); *H01L 21/76862* (2013.01);

(Continued)

(58) Field of Classification Search
CPC ......... H01L 21/76838; H01L 21/28556; H01L 23/53266; H01L 21/76843; C23C 16/56; C23C 16/46; C23C 16/4584; C23C 16/4586

See application file for complete search history.

(56) References Cited

U.S. PATENT DOCUMENTS

| | | | | |
|---|---|---|---|---|
| 4,492,716 A | * | 1/1985 | Yamazaki | ............ H01L 29/161 |
| | | | | 118/50.1 |
| 5,855,681 A | * | 1/1999 | Maydan | ............ H01L 21/67167 |
| | | | | 118/719 |

(Continued)

OTHER PUBLICATIONS

U.S. Appl. No. 14/543,064, filed Nov. 17, 2014, Zope et al.
U.S. Appl. No. 14/931,417, filed Nov. 3, 2015, Ai et al.
U.S. Appl. No. 15/019,587, filed Feb. 9, 2016, Tao et al.

*Primary Examiner* — Richard Booth
(74) *Attorney, Agent, or Firm* — Moser Taboada; Alan Taboada

(57) ABSTRACT

Methods and apparatus for depositing a cobalt layer in features formed on a substrate are provided herein. In some embodiments, a method of depositing a cobalt layer atop a substrate includes: (a) providing a substrate to a substrate support that is rotatable between two processing positions; (b) exposing the substrate to a cobalt containing precursor at a first processing position to deposit a cobalt layer atop the substrate; (c) rotating the substrate having the deposited cobalt layer to a second processing position; and (d) treating the substrate at the second processing position to remove contaminants from the cobalt layer.

17 Claims, 5 Drawing Sheets

(51) Int. Cl.
*H01L 21/285* (2006.01)
*H01L 21/768* (2006.01)
*H01L 23/532* (2006.01)

(52) U.S. Cl.
CPC .. *H01L 21/76877* (2013.01); *H01L 23/53266* (2013.01); *H01L 2924/0002* (2013.01)

(56) References Cited

U.S. PATENT DOCUMENTS

| | | | |
|---|---|---|---|
| 6,096,644 | A | 8/2000 | Lukanc |
| 6,245,655 | B1 | 6/2001 | Moslehi |
| 6,559,026 | B1 | 5/2003 | Rossman et al. |
| 6,797,340 | B2 | 9/2004 | Fang et al. |
| 7,510,634 | B1 | 3/2009 | Klawuhn et al. |
| 8,476,162 | B2 | 7/2013 | Ha et al. |
| 8,637,390 | B2 | 1/2014 | Ganguli et al. |
| 2002/0029958 | A1 | 3/2002 | Chiang et al. |
| 2002/0192396 | A1 | 12/2002 | Wang et al. |
| 2004/0052972 | A1 | 3/2004 | Schmitt |
| 2005/0280118 | A1 | 12/2005 | Lin et al. |
| 2006/0251801 | A1 | 11/2006 | Weidman et al. |
| 2006/0252252 | A1 | 11/2006 | Zhu et al. |
| 2008/0063809 | A1 | 3/2008 | Lee et al. |
| 2010/0081275 | A1 | 4/2010 | Ishizaka et al. |
| 2010/0199914 | A1 | 8/2010 | Iza |
| 2011/0027973 | A1* | 2/2011 | Su .................. C23C 16/481 438/478 |
| 2011/0151664 | A1 | 6/2011 | Lee et al. |
| 2012/0012465 | A1 | 1/2012 | Kim et al. |
| 2012/0222620 | A1 | 9/2012 | Yudovsky |
| 2013/0192761 | A1 | 8/2013 | Yudovsky et al. |
| 2013/0273729 | A1 | 10/2013 | Hempel et al. |
| 2015/0147889 | A1* | 5/2015 | Yudovsky .......... H01L 21/0228 438/758 |
| 2015/0203961 | A1 | 7/2015 | Ha et al. |
| 2015/0262828 | A1 | 9/2015 | Brand et al. |
| 2016/0017482 | A1 | 1/2016 | Trivedi |
| 2016/0035619 | A1 | 2/2016 | Yu et al. |

* cited by examiner

METHODS AND APPARATUS FOR CHEMICAL VAPOR DEPOSITION OF A COBALT LAYER

CROSS-REFERENCE TO RELATED APPLICATIONS

This application claims benefit of U.S. provisional patent application Ser. No. 62/032,341, filed Aug. 1, 2014, and U.S. provisional patent application Ser. No. 62/032,391, filed Aug. 1, 2014, each of which are herein incorporated by reference in their entireties.

FIELD

Embodiments of the present disclosure generally relate to substrate processing methods and apparatus, and more specifically, to improved methods and apparatus for depositing cobalt on a substrate.

BACKGROUND

The inventors have observed that chemical vapor deposition (CVD) of cobalt can be used as a metal deposition technique for applications such as forming metal interconnects in an integrated circuit. Cobalt may be deposited by chemical vapor deposition within an opening, such as a via or trench, in thin layers and then treated to drive out impurities such as carbon, hydrogen, and oxygen.

Thus, the inventors have provided improved methods and apparatus for depositing a cobalt layer in features formed on a substrate.

SUMMARY

Methods and apparatus for depositing a cobalt layer in features formed on a substrate are provided herein. In some embodiments, a method of depositing a cobalt layer atop a substrate includes: (a) providing a substrate to a substrate support that is rotatable between two processing positions; (b) exposing the substrate to a cobalt containing precursor at a first processing position to deposit a cobalt layer atop the substrate; (c) rotating the substrate having the deposited cobalt layer to a second processing position; and (d) treating the substrate at the second processing position to remove contaminants from the cobalt layer.

In some embodiments, a substrate processing chamber includes: a chamber body having a processing volume; a rotatable substrate support disposed within the chamber body, wherein the substrate support is configured to rotate one or more substrates arranged in a planar array between a first processing position and a second processing position; a showerhead disposed opposite the rotatable substrate support configured to expose the one or more substrates at the first processing position to a cobalt containing precursor; and a heat source configured to heat the one or more substrates at the second processing position.

In some embodiments, a computer readable medium is provided having instructions stored thereon that, when executed, causes a process chamber to perform a method for depositing a cobalt layer atop a substrate. The method may include any of the methods disclosed herein.

Other embodiments and variations of the present disclosure are discussed below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

Figure 1:
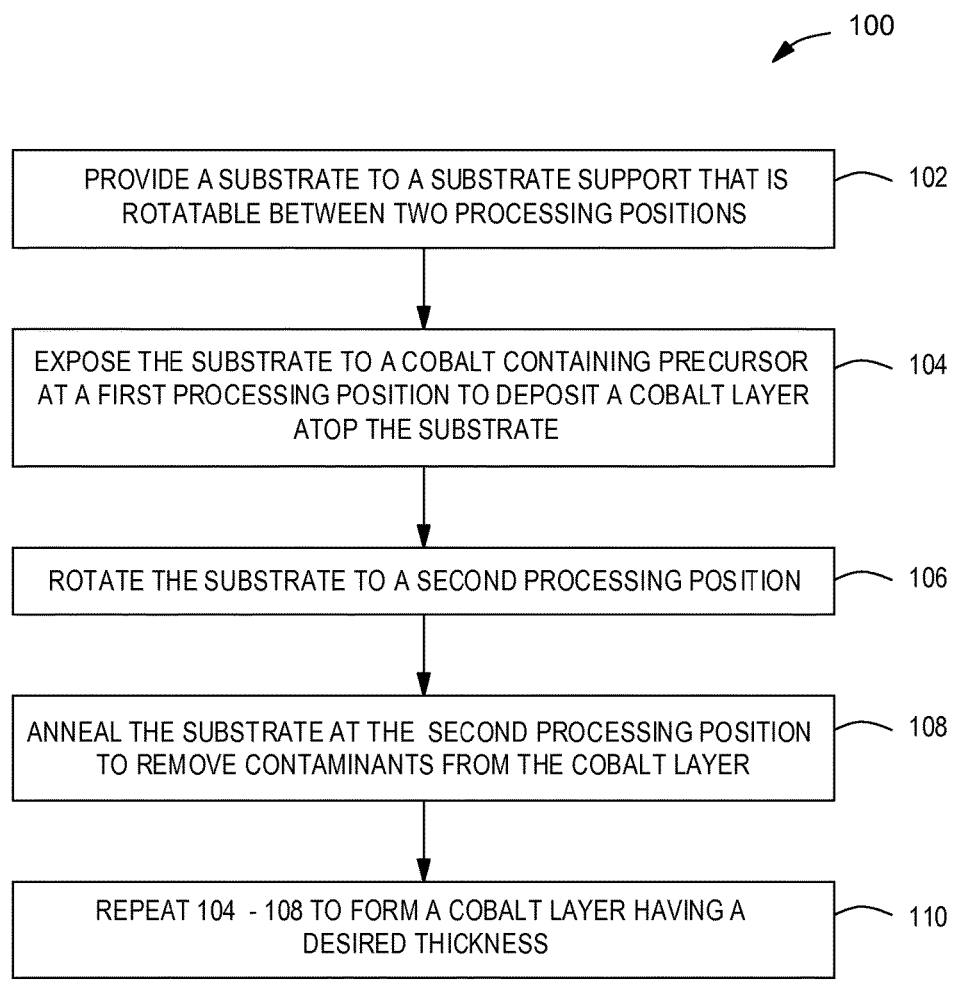
FIG. 1 depicts a method of depositing a cobalt layer atop a substrate in accordance with some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Methods and apparatus for depositing a cobalt layer in features formed on a substrate are provided herein. In some embodiments of the present disclosure, cobalt is deposited within an opening in thin layers and then subjected to a treatment process to drive out impurities. In some embodiments of the present disclosure, the inventive methods and apparatus described herein advantageously combine the cobalt deposition and treatment process in a single chamber to improve cycle time and throughput. The inventive methods described herein may be utilized in the formation of metal interconnects in an integrated circuit as well as other suitable applications where depositing a cobalt fill layer with improved properties, cycle time and throughput may be desired.

Figure 2A:
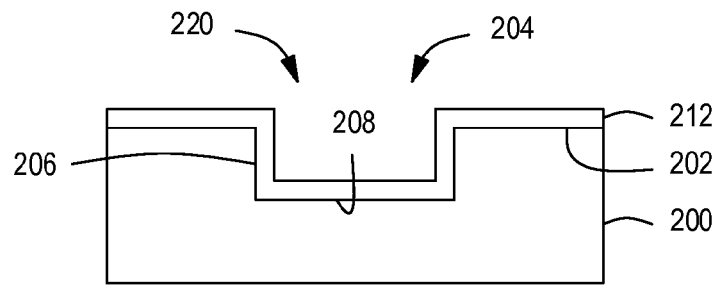
FIGS. 2A-D depicts the stages of filling a feature with cobalt in accordance with some embodiments of the present disclosure.
Figure 2B:
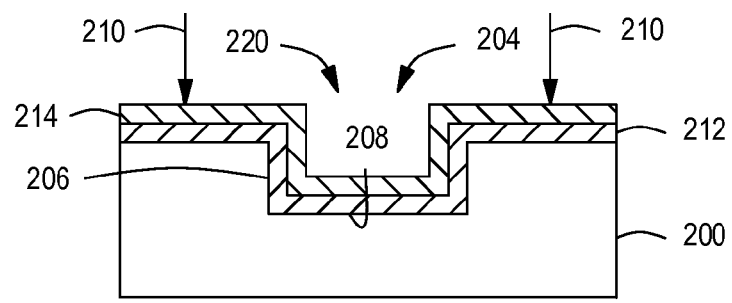

FIG. 1 is a flow diagram of a method 100 for depositing cobalt in accordance with some embodiments of the present disclosure. The method 100 is described below with respect to the stages of filling a feature with cobalt as depicted in FIGS. 2A-2B.

The method begins at 102 by providing one or more substrates to a rotatable substrate support. The substrate support is rotatable between at least two processing positions. In some embodiments, the substrate support may rotate one or more substrates between a first processing position, where a cobalt layer is deposited onto the one or more substrates, and a second processing position where the cobalt layer is subjected to a treatment process to, for example reduce or remove contaminants from the cobalt layer.

Figure 3:
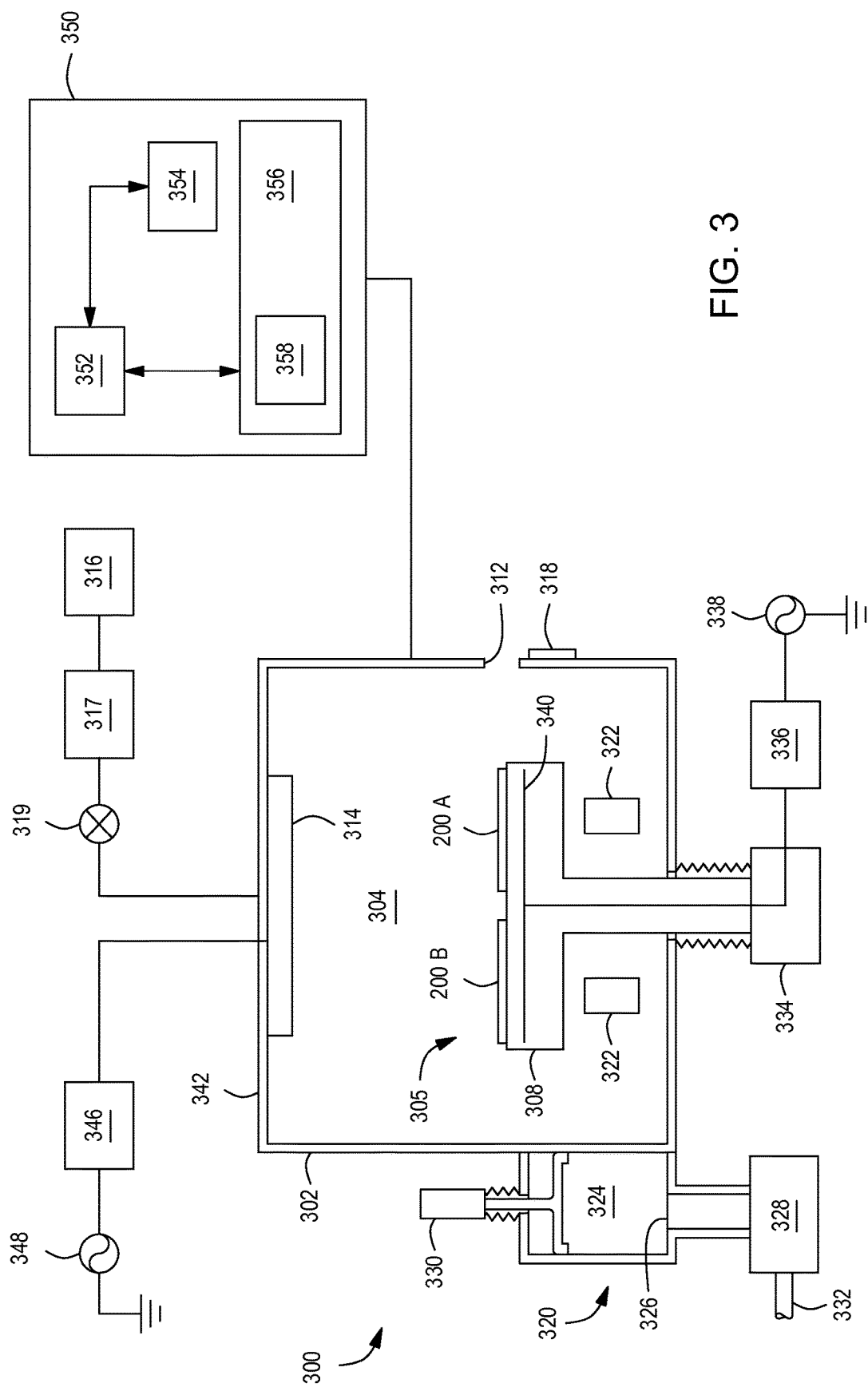
FIG. 3 depicts a process chamber suitable for performing a method of depositing cobalt in features formed on a substrate in accordance with some embodiments of the present disclosure.
Figure 4:
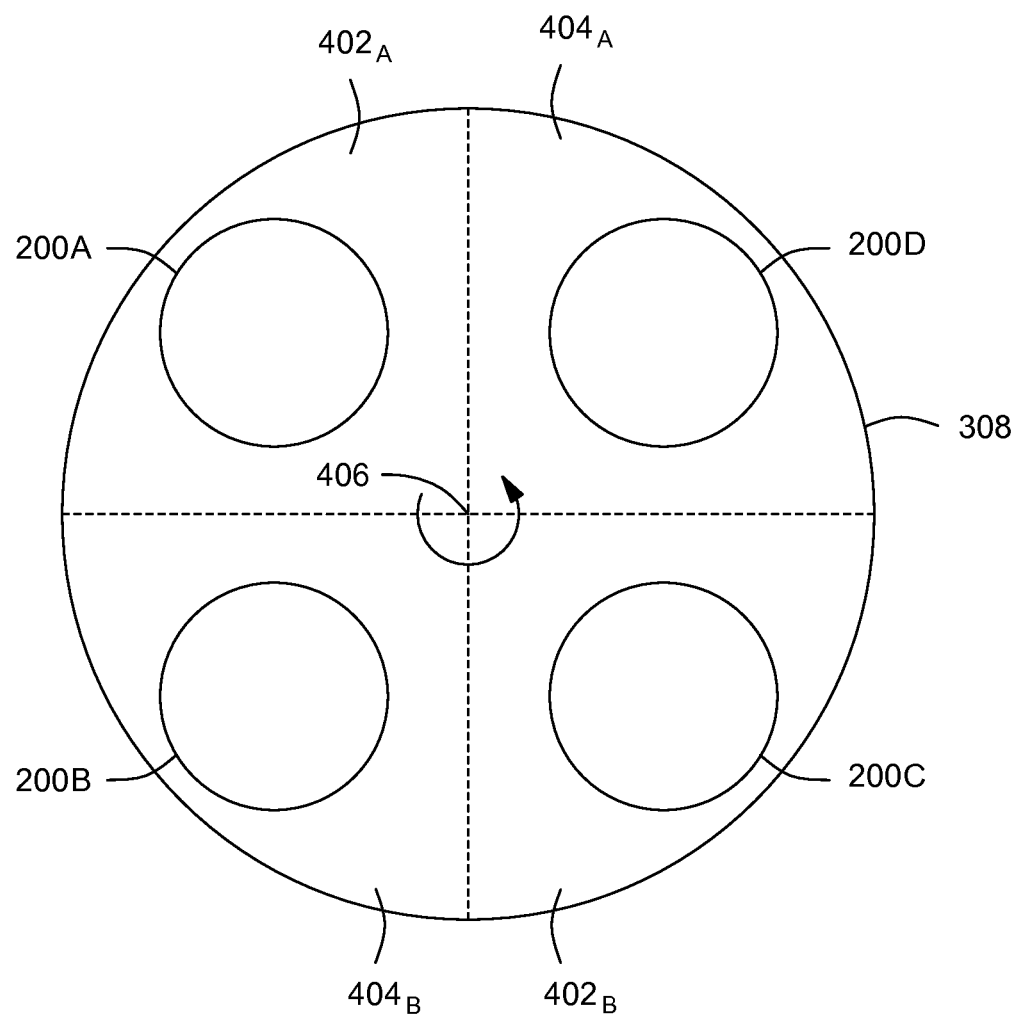
FIG. 4 depicts a top view of a substrate support suitable for performing a method of depositing cobalt in features formed on a substrate in accordance with some embodiments of the present disclosure.
Figure 5:
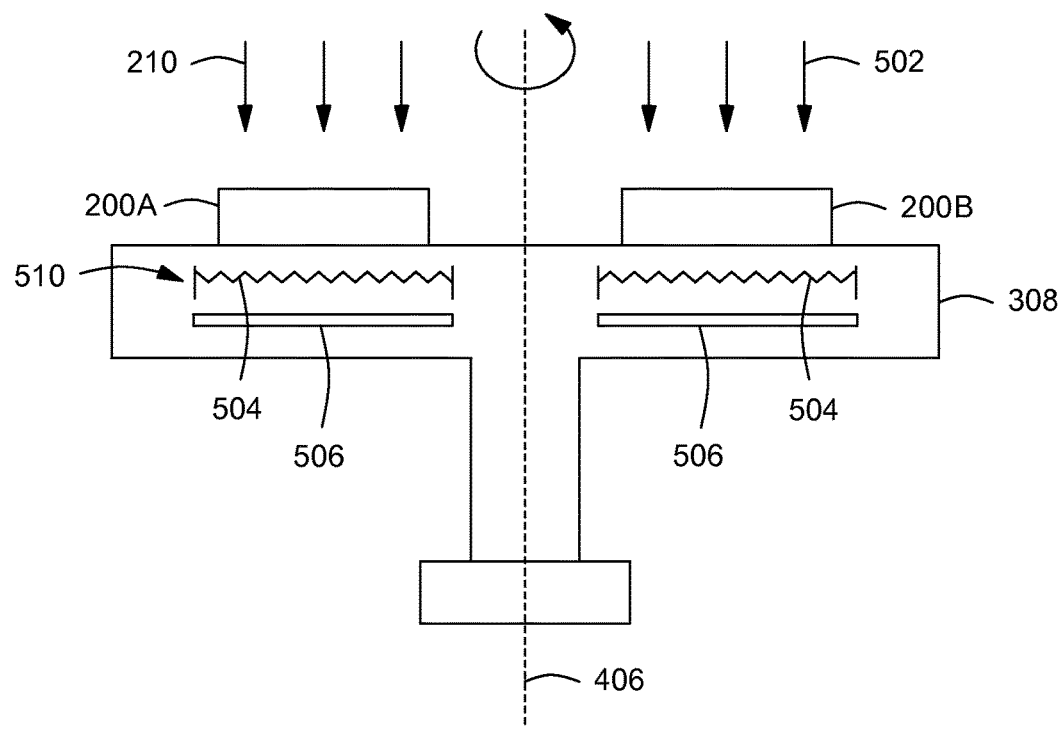
FIG. 5 depicts a side view of a substrate support suitable for performing a method of depositing cobalt in features formed on a substrate in accordance with some embodiments of the present disclosure.

For example, in some embodiments, the substrate support is substrate support 308 depicted in FIG. 3, FIG. 4, and FIG. 5. FIG. 3 depicts a schematic diagram of an illustrative apparatus 300 of the kind that may be used to practice embodiments of the disclosure as discussed herein. The apparatus 300 depicted in FIG. 3 comprises a process chamber 302 having a substrate support 308 disposed in the process chamber 302 for supporting one or more substrates thereupon during processing. In FIG. 3, two substrates 200A and 200B are shown. However, in the present disclosure the substrates are sometimes referred to in aggregate as one or more substrate 200.

FIG. 4 depicts a top view of the substrate support 308 having one or more substrates disposed thereon. In some embodiments, the substrate support 308 may support between 2 and 6 substrates. For example, FIG. 4 depicts a substrate support having four substrates 200A, 200B, 200C, and 200D arranged in a planar array with two substrates 200A, 200C at first processing positions 402A and 402B and two substrates 200B, 200D at second processing positions 404A and 404B. Thus, for example, the substrate support provides support for a plurality of single substrates in a planar array with each single substrate being in a separate processing position. As shown in FIG. 4, multiple processing positions can be configured for the same process (e.g., two first processing positions for example for deposition and two second processing positions for example for annealing). Alternatively, each processing position may be configured for a different process (e.g., a first processing position for a pre-cobalt deposition treatment, a second processing position for a cobalt deposition, a third processing position for plasma treatment, and a fourth processing position for annealing).

In some embodiments, the substrate support provides support for an even plurality of single substrates in an even plurality of separate processing positions, wherein half of the processing positions are configured for deposition and half of the processing positions are configured for a treatment process. In some embodiments, the substrate support provides support for an even plurality of single substrates in an even plurality of separate processing positions, wherein all of the processing positions are configured for both deposition and treatment processing and the appropriate process can be chosen depending upon the need.

FIG. 5 depicts a side view of the substrate support 308. In some embodiments, the substrate support 308 may rotate in a clockwise or counterclockwise direction about a center 406 of the substrate support 308. In some embodiments, the substrate support 308 may include a mechanism that retains or supports the one or more substrates 200 on the surface of the substrate support 308, such as an electrostatic chuck, a vacuum chuck, a substrate retaining clamp, or the like (not shown).

As depicted in FIG. 2A, the one or more substrates 200 includes a first surface 202 having a feature 204 formed in the first surface 202 of the one or more substrate 200. The feature 204 comprises an opening 220 formed in the first surface 202 of the one or more substrates 200 and extending into the one or more substrates 200 towards an opposing second surface of the one or more substrates 200. For example, the one or more substrates 200 may comprise one or more of silicon (Si), silicon oxide ($SiO_2$), or the like. In addition, the one or more substrates 200 may include additional layers of materials or may have one or more completed or partially completed structures formed therein or thereon.

The opening 220 may be any suitable opening such as a via, trench, dual damascene structure, or the like. In some embodiments, the feature 204 may have any suitable height to width aspect ratio. For example, in some embodiments, the feature 204 may have a height to width aspect ratio of about 3:1 to about 15:1. The opening 220 may be formed by etching the one or more substrates 200 using any suitable etch process. The opening 220 is defined by one or more sidewalls 206 and a bottom 208.

In some embodiments, a first layer 212 is formed atop the first surface 202, the bottom 208, and the sidewalls 206 prior to depositing cobalt material as described at 106 below. In some embodiments, the first layer 212 may be an oxide material, such as silicon oxide ($SiO_2$) or the like. The oxide material may be deposited or grown by any suitable oxidation process using any suitable process chamber, for example a chemical vapor deposition (CVD) chamber. The oxide material may serve as an electrical and/or physical barrier between the substrate and the cobalt-containing layer to be subsequently deposited in the opening 220, and/or may function as a better surface for attachment during the deposition process discussed below than a native surface of the substrate. In some embodiments, the first layer 212 may include a barrier material deposited atop the oxide layer. In some embodiments, an oxide layer is not present and the barrier material may be the first layer 212 formed atop the first surface 202, the bottom 208 and sidewalls 206 of the feature 204. The barrier material may serve a similar purpose as the oxide material discussed above. In some embodiments, the barrier material may include at least one of titanium (Ti), tantalum (Ta), and oxides or nitrides of Ti, Ta, or the like. The barrier material may be deposited by any suitable methods, such as by CVD or PVD. In some embodiments, a silicon containing layer is formed atop the first surface of the substrate by exposing the substrate to a plasma formed from a silicon containing gas such as silane ($SiH4$) or derivatives thereof (e.g., disilane, trisilane, tetrasilane, chlorosilane, dichlorosilane, tetrachlorosilane, hexachlorodisilane, methylsilane, or the like). In some embodiments, a silicon containing layer is formed atop the first surface of the substrate by exposing the substrate to a plasma formed from a silicon containing gas such as a methylaminosilane complex or a ethylaminosilane complex. The presence of the silicon containing layer inhibits the deposition of a cobalt layer on the first surface of the substrate resulting in the deposition of the cobalt layer occurring faster on the sidewalls and bottom of the opening than on the first surface (e.g., the top surface) of the substrate. The feature may thus advantageously be filled with cobalt without the formation of a void Next, at 104, and as depicted in FIG. 2B, the one or more substrates 200 are exposed to a cobalt containing precursor 210 to deposit a cobalt layer 214 atop the one or more substrates 200 and within the feature 204. Each substrate in a first processing position, for example substrates 200A, 200C as shown in FIG. 4, are exposed to the cobalt containing precursor 210. In some embodiments, as depicted in FIG. 5, substrate 200A at the first processing position is exposed to the cobalt containing precursor 210 while a flow of inert gas 502, such as nitrogen ($N_2$), is provided to the second processing positions to prevent cobalt containing precursor gas from straying into the second processing positions and depositing a cobalt layer atop substrates 200B, 200D in the second processing positions. In some embodiments, the deposited cobalt layer may be subject to an etch process to reduce overhang at the first surface 202 proximate the opening of the feature.

Figure 6:
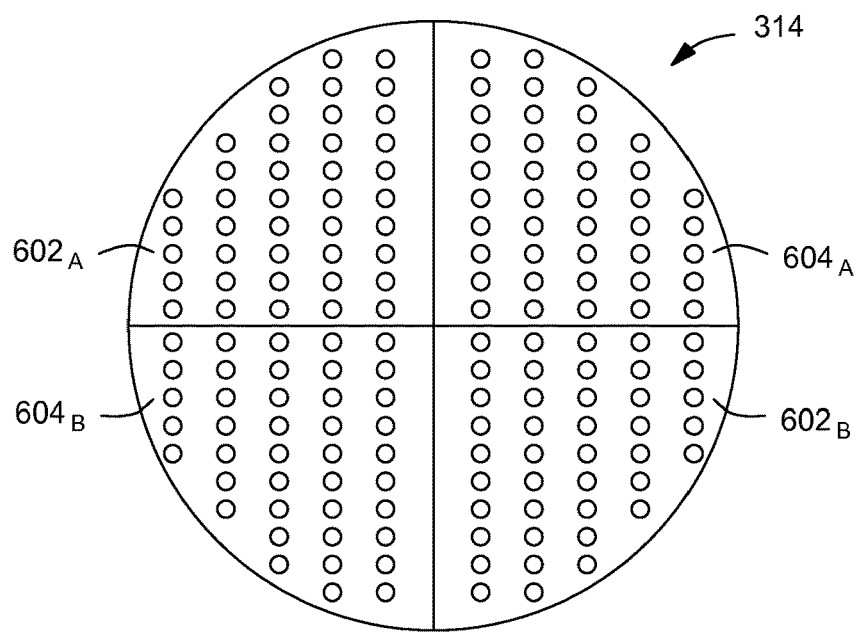
FIG. 6 depicts a bottom view of a showerhead suitable for performing a method of depositing cobalt in features formed on a substrate in accordance with some embodiments of the present disclosure.

The cobalt containing precursor 210 and the inert gas may be provided to the process chamber 302 using any suitable showerhead 314. The showerhead 314 may have a variety of configurations, such as providing gases to one zone or multiple zones of the process chamber. In some embodiments, the showerhead 314, as depicted in FIG. 6 may have multiple zones corresponding to the first and second processing positions 402A-B and 404A-B of the substrate support 308. For example, as depicted in FIG. 6, the showerhead 314 may have first zones 602A and 602B, which for example can supply cobalt containing precursor 210 to the first processing positions 402A and 402B, and second zones 604A and 604B, which for example can supply an inert gas to the second processing positions 404A and 404B to prevent the cobalt containing precursor gas from straying into the second processing positions.

In some embodiments, the one or more substrates 200 are exposed to the cobalt containing precursor 210 at a suitable flow rate for forming a cobalt layer 214 having a predetermined thickness. In some embodiments, the cobalt containing precursor 210 is provided at a flow rate of about 750 sccm to about 1000 sccm. In some embodiments, suitable cobalt precursors are carbonyl free. In some embodiments, suitable cobalt precursors are carbonyl free and have a high vapor pressure (e.g., greater than 1 Torr). In some embodiments, suitable cobalt precursors may include cobalt cyclohexadienyl complexes, cobalt diazadienyl complexes, cobalt tert-butyl complexes, cobalt allyl complexes, cobalt carbonyl complexes, cobalt amidinate compounds, cobaltocene compounds, cobalt dienyl complexes, cobalt nitrosyl complexes, derivatives thereof, complexes thereof, plasmas thereof, or combinations thereof. In some embodiments, dicobalt hexacarbonyl acetyl compounds may be used to form the cobalt layer. Dicobalt hexacarbonyl acetyl compounds may have the chemical formula of $(CO)_6Co_2(RC{\equiv}CR')$, wherein R and R' are independently selected from hydrogen, methyl, ethyl, propyl, isopropyl, butyl, tertbutyl, penta, benzyl, aryl, isomers thereof, derivatives thereof, or combinations thereof. In one example, dicobalt hexacarbonyl butylacetylene (CCTBA, $(CO)_6Co_2(HC{\equiv}CtBu)$) is the cobalt precursor. Other examples of dicobalt hexacarbonyl acetyl compounds include dicobalt hexacarbonyl methylbutylacetylene ($(CO)_6Co_2(MeC{\equiv}CtBu)$), dicobalt hexacarbonyl phenylacetylene ($(CO)_6Co_2(HC{\equiv}CPh)$), hexacarbonyl methylphenylacetylene ($(CO)_6Co_2(MeC{\equiv}CPh)$), dicobalt hexacarbonyl methylacetylene ($(CO)_6Co_2(HC{\equiv}CMe)$), dicobalt hexacarbonyl dimethylacetylene ($(CO)_6Co_2(MeC{\equiv}CMe)$), derivatives thereof, complexes thereof, or combinations thereof. Other exemplary cobalt carbonyl complexes include cyclopentadienyl cobalt bis (carbonyl) ($CpCo(CO)_2$), tricarbonyl allyl cobalt ($(CO)_3Co(CH_2CH{=}CH_2)$), or derivatives thereof, complexes thereof, or combinations thereof. In some embodiments, the method may further comprise flowing a reactant gas, such as hydrogen ($H_2$), nitrogen ($N_2$), ammonia ($NH_3$), carbon monoxide (CO), or a combination thereof, along with the precursor gases. General processing conditions for forming the cobalt layer discussed above include maintaining process chamber pressure at about 15 to about 25 Torr.

In some embodiments, the cobalt layer 214 may be formed via a plasma assisted deposition process, such as a plasma enhanced chemical vapor deposition process or a thermal chemical vapor deposition process. In some embodiments, for example, the one or more substrates 200 may be exposed to the cobalt containing precursor 210 in a plasma state. The plasma may be formed by coupling sufficient energy, for example radio frequency (RF) energy from a power source to ignite the cobalt precursor to form the plasma. In some embodiments, the power source may illustratively provide about 400 watts, of power at a suitable frequency, such as about 13.56 MHz. The plasma facilitates a decomposition of the precursor, causing a deposition of material on the one or more substrates 200 to form the cobalt layer 214.

Next, at 106, the substrate having a cobalt layer deposited thereon is rotated to a second processing position. As depicted in FIG. 4, substrates 200A, 200C having a cobalt layer deposited thereon are rotated to the second processing position 404, while substrates 200B, 200D rotate to the first processing position 402 to have a cobalt layer deposited thereon as described above at 104.

Figure 2C:
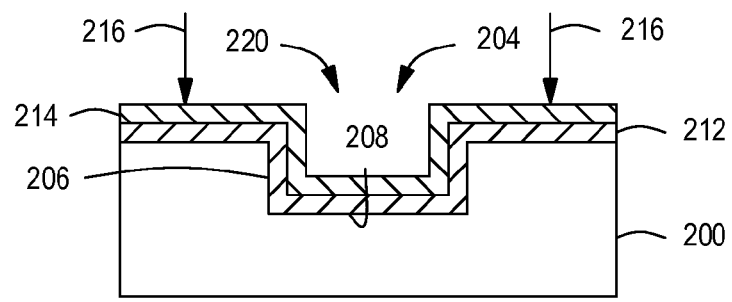

Next, at 108, and as depicted in FIG. 2C, the one or more substrates 200 at the second processing position are treated 216 to remove contaminants from the cobalt layer. In some embodiments, for example, the substrates at the second processing position, for example substrates 200B, 200D as shown in FIG. 4 are subjected to a plasma treatment. In some embodiments, the cobalt layer 214 is exposed to plasma suitable for reducing or removing contaminants such as carbon and oxygen from the cobalt layer 214. In some embodiments, the plasma may be formed in a low pressure process, for example such as less than 100 mTorr. In some embodiments, the plasma is formed from a process gas suitable for reducing or removing contaminants such as carbon and oxygen from the cobalt layer 214. For example, in some embodiments, the process gas may be hydrogen ($H_2$), ammonia ($NH_3$), nitrogen ($N_2$), tetrahydrofuran (THF), or a combination thereof. In some embodiments, the plasma may be formed using any suitable plasma forming process. For example, in some embodiments, the plasma is an inductively coupled plasma. In some embodiments, the plasma is a capacitively coupled plasma. In some embodiments, the plasma may be formed in situ in the process chamber (e.g., a direct plasma), or the plasma may be formed outside of the process chamber (e.g., a remote plasma). In some embodiments, the process gas may be ignited using an RF power source. In some embodiments, the process gas may be ignited using a high density power source, for example a microwave power source.

In some embodiments, the substrates at the second processing position, for example substrates 200B, 200D as shown in FIG. 4, are annealed. The one or more substrates 200 are annealed at a temperature of about 400 to about 500 degrees Celsius. In some embodiments, each substrate is annealed for about 50 to about 150 seconds. In some embodiments, after annealing, the one or more substrates 200 may be cooled to a temperature suitable for cobalt deposition. The one or more substrates 200 may be cooled at the second processing position, or may be rotated to the first processing position and cooled prior to cobalt deposition, or a combination thereof.

In some embodiments, the substrate support 308 may include mechanisms for controlling the substrate temperature such as heating and/or cooling devices for heating the substrate and/or cooling the substrate. For example, in some embodiments, such as depicted in FIG. 5, the one or more substrates 200 are heated or cooled using a thermal control device 510 embedded in a substrate support. In some embodiments, the thermal control device 510 is a heater 504. The heater 504 may be any type of heater used to heat a process chamber component. For example, in some embodiments, the heater 504 may comprise one or more electrically resistive elements coupled to one or more power sources (e.g., resistive heaters). In some embodiments, multiple electrically restive elements may be utilized to provide separate heating zones within the substrate support. In embodiments where the substrate support comprises multiple zones or multiple heaters in each processing position, power to all of the multiple zones or multiple heaters may be applied at an independent rate for each one of the multiple zones or multiple heaters. For example, in some embodiments, the substrate support may comprise two heaters creating two heating zones, a center or inner heating zone and an edge or outer heating zone wherein the temperature of each zone is independently controllable. Alternatively, In some embodiments, the one or more substrates 200 may be heated by one or more lamp heads (not shown), which is disposed in a position relative to the substrate support 308 suitable to heat the one or more substrates 200. The lamp head generates radiation which is directed to the top surface of the one or more substrates 200. Alternatively, the lamp head may be configured to heat the bottom surface of the one or more substrates 200, for example, such as by being disposed below the substrate support, or by directing the radiation to the bottom surface of the one or more substrates 200. The lamps may be divided into multiple zones. The zones can be individually adjusted by a controller to allow controlled radiative heating of different areas of the substrate support. In some embodiments, the thermal control device 510 may include a heat exchanger 506 for example having a coolant flowing therethrough to remove heat from heated substrates, for example following an anneal process.

Figure 2D:
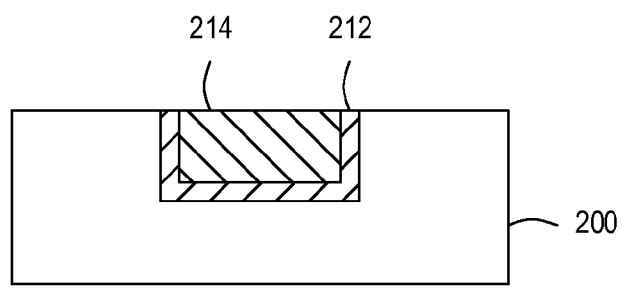

At 110, 104-108 as depicted in FIG. 2D, may be optionally repeated until the opening is filled with a cobalt material or until the deposited cobalt layer has a predetermined thickness. Further, when the feature 204 has been filled by the cobalt material, the opening 220 may be filled above the level of the upper surface of the substrate and/or deposited material, for example from the cobalt material, may remain on the upper surface of the one or more substrates 200. Accordingly, techniques, such as wet clean in an acidic solution, chemical or electrochemical mechanical polishing, or the like may be used to remove excess deposited material from the upper surface, such that the opening 220 is filled with the deposited cobalt material up to about an equivalent level with the upper surface.

Returning to FIG. 3, the apparatus 300 may comprise a controller 350 and a process chamber 302 having an exhaust system 320 for removing excess process gases, processing by-products, or the like, from the inner volume 305 of the process chamber 302. Exemplary process chambers may include any of several process chambers configured for chemical vapor deposition (CVD), available from Applied Materials, Inc. of Santa Clara, Calif. Other suitable process chambers from other manufacturers may similarly be used. Such process chambers may be standalone process chambers or part of a cluster tool, such as the CENTURA®, ENDURA®, or PRODUCER® line of process tools also available from Applied Materials, Inc. of Santa Clara, Calif.

The process chamber 302 has an inner volume 305 that includes a processing volume 304. The processing volume 304 may be defined, for example, between a substrate support 308 disposed within the process chamber 302 for supporting one or more substrates 200 thereupon during processing and one or more gas inlets, such as a showerhead 314 and/or nozzles provided at predetermined locations. In some embodiments, the substrate support 308 may include a mechanism that retains or supports the one or more substrates 200 on the surface of the substrate support 308, such as an electrostatic chuck, a vacuum chuck, a substrate retaining clamp, or the like (not shown). In some embodiments, the substrate support 308 may include mechanisms for controlling the substrate temperature and/or for controlling the species flux and/or ion energy proximate the substrate surface.

For example, in some embodiments, the substrate support 308 may include an RF bias electrode 340. The RF bias electrode 340 may be coupled to one or more bias power sources (one bias power source 338 shown) through one or more respective matching networks (matching network 336 shown). The one or more bias power sources may be capable of producing up to 1200 W or RF energy at a frequency of about 2 MHz to about 60 MHz, such as at about 2 MHz, or about 13.56 MHz, or about 60 Mhz. In some embodiments, two bias power sources may be provided for coupling RF power through respective matching networks to the RF bias electrode 340 at respective frequencies of about 2 MHz and about 13.56 MHz. The at least one bias power source may provide either continuous or pulsed power. In some embodiments, the bias power source alternatively may be a DC or pulsed DC source.

The one or more substrates 200 may enter the process chamber 302 via an opening 312 in a wall of the process chamber 302. The opening 312 may be selectively sealed via a slit valve 318, or other mechanism for selectively providing access to the interior of the chamber through the opening 312. The substrate support 308 may be coupled to a lift mechanism 334 that may control the position of the substrate support 308 between a lower position (as shown) suitable for transferring substrates into and out of the chamber via the opening 312 and a selectable upper position suitable for processing. The process position may be selected to maximize process uniformity for a particular process. When in at least one of the elevated processing positions, the substrate support 308 may be disposed above the opening 312 to provide a symmetrical processing region.

The one or more gas inlets (e.g., the showerhead 314) may be coupled to one or more gas supplies 316 for providing one or more process gases through a mass flow controller 317 into the processing volume 304 of the process chamber 302. In addition, one or more valves 319 may be provided to control the flow of the one or more process gases. The mass flow controller 317 and one or more valves 319 may be used individually, or in conjunction to provide the process gases at predetermined flow rates at a constant flow rate, or pulsed (as described above).

Although a showerhead 314 is shown in FIG. 3, additional or alternative gas inlets may be provided such as nozzles or inlets disposed in the ceiling or on the sidewalls of the process chamber 302 or at other locations suitable for providing gases to the process chamber 302, such as the base of the process chamber, the periphery of the substrate support, or the like.

The apparatus 300 may utilize capacitively coupled RF energy for plasma processing. For example, the process chamber 302 may have a ceiling 342 made from dielectric materials and a showerhead 314 that is at least partially conductive to provide an RF electrode (or a separate RF electrode may be provided). The showerhead 314 (or other RF electrode) may be coupled to one or more RF power sources (one RF power source 348 shown) through one or more respective matching networks (matching network 346 shown). The one or more plasma sources may be capable of producing up to about 3,000 W, or in some embodiments, up to about 5,000 W, of RF energy at a frequency of about 2 MHz and/or about 13.56 MHz or a high frequency, such as 27 MHz and/or 60 MHz. The exhaust system 320 generally includes a pumping plenum 324 and one or more conduits that couple the pumping plenum 324 to the inner volume 305 (and generally, the processing volume 304) of the process chamber 302.

A vacuum pump 328 may be coupled to the pumping plenum 324 via a pumping port 326 for pumping out the exhaust gases from the process chamber via one or more exhaust ports (two exhaust ports 322 shown). 302. The vacuum pump 328 may be fluidly coupled to an exhaust outlet 332 for routing the exhaust to appropriate exhaust handling equipment. A valve 330 (such as a gate valve, or the like) may be disposed in the pumping plenum 324 to facilitate control of the flow rate of the exhaust gases in combination with the operation of the vacuum pump 328. Although a z-motion gate valve is shown, any suitable, process compatible valve for controlling the flow of the exhaust may be utilized.

To facilitate control of the process chamber 302 as described above, the controller 350 may be any form of general-purpose computer processor that can be used in an industrial setting for controlling various chambers and sub-processors. The memory, or computer-readable medium, 356 of the CPU 352 may be one or more of readily available memory such as random access memory (RAM), read only memory (ROM), floppy disk, hard disk, or any other form of digital storage, local or remote. The support circuits 354 are coupled to the CPU 352 for supporting the processor in a conventional manner. These circuits include cache, power supplies, clock circuits, input/output circuitry and subsystems, and the like.

The inventive methods disclosed herein may generally be stored in the memory 356 as a software routine 358 that, when executed by the CPU 352, causes the process chamber 302 to perform processes of the present disclosure. The software routine 358 may also be stored and/or executed by a second CPU (not shown) that is remotely located from the hardware being controlled by the CPU 352. Some or all of the method of the present disclosure may also be performed in hardware. As such, embodiments of the present disclosure may be implemented in software and executed using a computer system, in hardware as, e.g., an application specific integrated circuit or other type of hardware implementation, or as a combination of software and hardware. The software routine 358 may be executed after the one or more substrates 200 is positioned on the substrate support 308. The software routine 358, when executed by the CPU 352, transforms the general purpose computer into a specific purpose computer (controller) 350 that controls the chamber operation such that the methods disclosed herein are performed.

The disclosure may be practiced using other semiconductor substrate processing systems wherein the processing parameters may be adjusted to achieve acceptable characteristics by those skilled in the art by utilizing the teachings disclosed herein without departing from the spirit of the disclosure.

While the foregoing is directed to embodiments of the present disclosure, other and further embodiments of the disclosure may be devised without departing from the basic scope thereof.

The invention claimed is:

1. A method of depositing a cobalt layer atop a substrate, comprising:
   (a) providing a substrate to a substrate support that is rotatable about a center of the substrate support between two static processing positions with gas injection and disposed within a common processing volume of a process chamber;
   (b) exposing the substrate to a cobalt containing precursor at a first static processing position to deposit a cobalt layer atop the substrate;
   (c) rotating the substrate having the deposited cobalt layer about the center of the substrate support to a second static processing position; and
   (d) treating the substrate at the second static processing position to remove contaminants from the cobalt layer while providing a flow of an inert gas to the second static processing position to inhibit the cobalt containing precursor gas from straying from the first static processing position into the second static processing position.

2. The method of claim 1, further comprising repeating (b)-(d) to form a cobalt layer having a predetermined thickness.

3. The method of claim 1, wherein treating the substrate comprises exposing the substrate to a plasma formed from a process gas.

4. The method of claim 3, wherein the process gas comprises hydrogen ($H_2$), ammonia ($NH_3$), nitrogen ($N_2$), tetrahydrofuran (THF), or a combination thereof.

5. The method of claim 3, wherein the plasma is a direct plasma.

6. The method of claim 3, wherein the plasma is a remote plasma.

7. The method of claim 1, wherein treating the substrate comprises annealing the substrate.

8. The method of claim 7, wherein annealing the substrate comprises heating the substrate to a temperature of about 400 degrees Celsius to about 500 degrees Celsius.

9. The method of claim 7, further comprising annealing the substrate for about 50 seconds to about 150 seconds.

10. The method of claim 1, further comprising providing at least 2 substrates to the substrate support.

11. The method of claim 10, wherein a first set of substrates are at the first static processing position and exposed to the cobalt containing precursor to deposit the cobalt layer atop the first set of substrates.

12. The method of claim 11, wherein a second set of substrates are at the second static processing position.

13. The method of claim 12, wherein the substrate support rotates the first set of substrates to the second static processing position to treat the first set of substrates to remove contaminants from the cobalt layer and rotates the second set of substrates to the first static processing position to expose the second set of substrates to the cobalt containing precursor to deposit the cobalt layer atop the second set of substrates.

14. The method of claim 1, wherein the cobalt containing precursor is a carbonyl free precursor.

15. A non-transitory computer readable medium having instructions stored thereon that, when executed, cause a method of depositing a cobalt layer atop a substrate, the method comprising:
   (a) providing a substrate to a substrate support that is rotatable about a center of the substrate support between two static processing positions with gas injection and disposed within a common processing volume of a process chamber;
   (b) exposing the substrate to a cobalt containing precursor at a first static processing position to deposit a cobalt layer atop the substrate;
   (c) rotating the substrate about the center of the substrate support to a second static processing position; and
   (d) treating the substrate at the second static processing position to remove contaminants from the cobalt layer while providing a flow of an inert gas to the second static processing position to inhibit the cobalt containing precursor gas from straying from the first static processing position into the second static processing position.

16. The non-transitory computer readable medium of claim 15, further comprising instructions to repeat (b)-(d) to form a cobalt layer having a predetermined thickness.

17. The non-transitory computer readable medium of claim 15, wherein at least 2 substrates are provided to the substrate support, wherein a first set of substrates are at the first static processing position and exposed to the cobalt containing precursor to deposit the cobalt layer atop the first set of substrates, and wherein a second set of substrates are at the second static processing position, and wherein the substrate support rotates the first set of substrates to the second static processing position to treat the first set of substrates to remove contaminants from the cobalt layer and rotates the second set of substrates to the first static processing position to expose the second set of substrates to the cobalt containing precursor to deposit the cobalt layer atop the second set of substrates.

* * * * *